(12) United States Patent
Leung

(10) Patent No.: US 7,791,975 B2
(45) Date of Patent: Sep. 7, 2010

(54) SCALABLE EMBEDDED DRAM ARRAY

(75) Inventor: Wingyu Leung, Cupertino, CA (US)

(73) Assignee: MoSys, Inc., Sunnyvale, CA (US)

( * ) Notice: Subject to any disclaimer, the term of this patent is extended or adjusted under 35 U.S.C. 154(b) by 246 days.

(21) Appl. No.: 12/048,170

(22) Filed: Mar. 13, 2008

(65) Prior Publication Data
US 2008/0159036 A1 Jul. 3, 2008

Related U.S. Application Data

(60) Division of application No. 11/534,506, filed on Sep. 22, 2006, now Pat. No. 7,499,307, and a continuation-in-part of application No. 11/166,856, filed on Jun. 24, 2005, now Pat. No. 7,274,618.

(51) Int. Cl.
G11C 5/14 (2006.01)
G11C 7/02 (2006.01)

(52) U.S. Cl. ............... 365/226; 365/207; 365/210.12

(58) Field of Classification Search ............ 365/207, 365/226
See application file for complete search history.

(56) References Cited

U.S. PATENT DOCUMENTS

| | | |
|---|---|---|
| 4,446,536 A | 5/1984 | Rodgers |
| 5,365,479 A | 11/1994 | Hoang et al. |
| 5,438,543 A | 8/1995 | Yoon |
| 5,719,814 A | 2/1998 | Ishikawa |
| 5,822,252 A | 10/1998 | Lee et al. |
| 5,846,860 A | 12/1998 | Shih et al. |
| 5,917,766 A | 6/1999 | Tsuji et al. |
| 5,920,225 A | 7/1999 | Choi et al. |
| 5,963,477 A | 10/1999 | Hung |
| 6,028,804 A | 2/2000 | Leung |
| 6,031,779 A | 2/2000 | Takahashi et al. |
| 6,043,536 A | 3/2000 | Numata et al. |
| 6,075,720 A | 6/2000 | Leung et al. |
| 6,088,267 A | 7/2000 | Atsumi et al. |
| 6,140,175 A * | 10/2000 | Kleinhenz et al. ........... 438/243 |

(Continued)

OTHER PUBLICATIONS

"A 1-Mbit CMOS Dynamic RAM with a Divided Bitline Matrix Architecture", pp. 894-902, IEEE Journal of Solid-State Circuits, vol. SC-20, No. 5, Oct. 1985 by R. Taylor et al.

(Continued)

*Primary Examiner*—Ly D Pham
(74) *Attorney, Agent, or Firm*—Bever, Hoffman & Harms, LLP; E. Eric Hoffman

(57) ABSTRACT

A method and apparatus for scaling an embedded DRAM array from a first process to a second process, wherein the scaling involves reducing the linear dimensions of features by a constant scale factor. From the first process to the second process, DRAM cell capacitor layout area is reduced by the square of the scale factor, while cell capacitance is reduced by the scale factor. The voltage used to supply the logic transistors is scaled down from the first process to the second process. However, the voltage used to supply the sense amplifiers remains constant in both processes. Thus, in an embedded DRAM array of the second process, sense amplifiers are supplied by a greater voltage than the logic transistors. This allows the sensing voltage of DRAM cells to be maintained from one process generation to another, while allowing memory size to scale with the square of the process scale factor.

18 Claims, 7 Drawing Sheets

U.S. PATENT DOCUMENTS

| | | | |
|---|---|---|---|
| 6,147,914 | A | 11/2000 | Leung et al. |
| 6,166,987 | A | 12/2000 | Atsumi et al. |
| 6,187,618 | B1 | 2/2001 | Kao et al. |
| 6,190,988 | B1 * | 2/2001 | Furukawa et al. ........... 438/386 |
| 6,440,801 | B1 | 8/2002 | Furukawa et al. |
| 6,455,901 | B2 | 9/2002 | Kameyama et al. |
| 6,473,344 | B2 | 10/2002 | Kim et al. |
| 6,493,268 | B1 | 12/2002 | Khouri et al. |
| 6,496,034 | B2 | 12/2002 | Forbes et al. |
| 6,549,465 | B2 | 4/2003 | Hirano et al. |
| 6,573,548 | B2 | 6/2003 | Leung et al. |
| 6,600,186 | B1 | 7/2003 | Lee et al. |
| 6,661,699 | B1 | 12/2003 | Walker |
| 6,665,851 | B1 | 12/2003 | Donelly et al. |
| 6,718,431 | B2 | 4/2004 | Barth et al. |
| 6,865,114 | B2 | 3/2005 | Pio |
| 6,930,927 | B2 | 8/2005 | Pascucci |
| 6,940,759 | B2 | 9/2005 | Tsang et al. |
| RE38,944 | E | 1/2006 | Takahashi et al. |
| 7,020,024 | B2 | 3/2006 | Sim |
| 2001/0014045 | A1 | 8/2001 | Kitamoto et al. |
| 2001/0053093 | A1 | 12/2001 | Ogura et al. |
| 2002/0011883 | A1 | 1/2002 | Yamazaki et al. |
| 2002/0017947 | A1 | 2/2002 | Ooishi et al. |
| 2002/0041531 | A1 | 4/2002 | Tanaka et al. |
| 2002/0076880 | A1 | 6/2002 | Yamada et al. |
| 2002/0097628 | A1 | 7/2002 | Fujisawa et al. |
| 2002/0122344 | A1 | 9/2002 | Takemura et al. |
| 2003/0001181 | A1 | 1/2003 | Leung et al. |
| 2003/0002353 | A1 | 1/2003 | Lee |
| 2003/0058722 | A1 | 3/2003 | Park |
| 2003/0148580 | A1 * | 8/2003 | Chen et al. ................... 438/243 |
| 2003/0151072 | A1 | 8/2003 | Leung et al. |
| 2003/0185085 | A1 | 10/2003 | Kaneko |
| 2003/0223261 | A1 | 12/2003 | Kato et al. |
| 2004/0085835 | A1 | 5/2004 | Ahn et al. |
| 2005/0068838 | A1 | 3/2005 | Kono et al. |
| 2005/0117411 | A1 | 6/2005 | Koshikawa et al. |
| 2005/0174873 | A1 | 8/2005 | Ferrant et al. |
| 2005/0208727 | A1 | 9/2005 | Lin et al. |
| 2005/0280061 | A1 | 12/2005 | Lee |
| 2006/0007612 | A1 | 1/2006 | Lusky et al. |
| 2006/0112321 | A1 | 5/2006 | Leung |
| 2006/0172504 | A1 | 8/2006 | Sinitsky et al. |
| 2006/0273848 | A1 | 12/2006 | Yamazaki et al. |
| 2008/0288188 | A1 | 11/2008 | Chang et al. |

OTHER PUBLICATIONS

"Dual-Operating-Voltage Scheme for a Single 5-V 16-Mbit DRAM", pp. 1128, 1130 & 1132; IEEE Journal of Solid-State Circuits, vol. 23, No. 5, Oct. 1988, by M. Horiguchi et al.

"A Mechanically Enhanced Storage node for virtually unlimited Height (MESH) Capacitor Aiming at sub 70mm DRAMs", 4 pgs., 2004, by D.H. Kim et al.

* cited by examiner

SCALABLE EMBEDDED DRAM ARRAY

RELATED APPLICATIONS

The present application is a divisional of U.S. patent application Ser. No. 11/534,506 by Wingyu Leung, entitled "Scalable Embedded DRAM Array", which is a continuation-in-part of U.S. patent application Ser. No. 11/166,856 by Wingyu Leung, entitled "Word Line Driver For DRAM Embedded in A Logic Process".

The present application is also related to U.S. Pat. No. 6,028,804, by Wingyu Leung, entitled "Method and Apparatus for 1-T SRAM Compatible Memory", U.S. Pat. No. 6,573,548 B2 by Wingyu Leung and Fu-Chieh Hsu, entitled "DRAM cell having a capacitor structure fabricated partially in a cavity and method for operating the same", U.S. Pat. No. 6,147,914 by Wingyu Leung and Fu-Chieh Hsu, entitled "On-chip word line voltage generation for DRAM embedded in Logic Process", and U.S. Pat. No. 6,075,720 by Wingyu Leung and Fu-Chieh Hsu, entitled "Memory cell for DRAM embedded in Logic". As described in more detail below, these patent applications are incorporated by reference in their entirety.

FIELD OF THE INVENTION

The present invention is applicable to Dynamic Random Accessible Memory (DRAM). More specifically, it relates to a method and apparatus for increasing the sensing speed of sense-amplifiers in an embedded DRAM system. The present invention further relates to the scaling of DRAM cells using trench or stack capacitors in embedded memory applications.

RELATED ART

FIG. 1 is a schematic diagram of a conventional DRAM cell 100 which consists of a PMOS pass-gate select transistor 101 coupled to a storage capacitor 102. DRAM cell 100 is written, read and refreshed in a manner known to those of ordinary skill in the art, by applying access voltages to bit line 103, word line 104, the counter-electrode of storage capacitor 102, and the n-well region 105 in which PMOS transistor 101 is fabricated.

As the process technology continues to advance and device geometry continues to scale down, the lateral or planar dimensions of DRAM cell 100 are required to scale down in order to keep up with the technology scaling. Scaling down DRAM cell 100 advantageously reduces the required area-per-bit and thus the cost-per-bit of the memory. The general practice in DRAM scaling has been to reduce the area of DRAM cell 100, without substantially decreasing the capacitance of storage transistor 102 from one process generation to another.

Note DRAM cell 100 is typically fabricated using a process optimized for a DRAM system, and typically includes capacitor structures fabricated with multiple polysilicon and insulator layers, or in deep trenches, such that a standard DRAM cell has a capacitance greater than 20 fF (and typically about 30 fF).

For example, in the DRAM described in "A 1-Mbit CMOS Dynamic RAM with a Divided Bitline Matrix Architecture" by R. T. Taylor et al, IEEE JSSC, vol. SC-20, No. 5, pp. 894-902 (1985), a DRAM cell having a cell storage capacitance of 32 fF is fabricated using a process with critical dimensions of 0.9 um; in "Dual-Operating-Voltage Scheme for a Single 5-V 16-Mbit DRAM", by M. Horiguchi et al, IEEE JSSC, vol. 23, No. 5, pp. 1128-1132 (1988), a DRAM cell having a cell storage capacitance of 33 fF is fabricated using a 0.6 um process; and in "A Mechanically Enhanced Storage Node for Virtually Unlimited Height (MESH) Capacitor Aiming at sub 70 nm DRAMs", by D. H. Kim et al, IEDM Tech. Dig., pp. 69-72 (2004), a DRAM cell having a cell storage capacitance of 30 fF is fabricated using a 70 nm process. Thus, a DRAM cell storage capacitance of approximately 30 fF has been maintained through many generations of process scaling.

The reasoning for maintaining a constant DRAM cell storage capacitance is described below. In general, a constant storage capacitance has been deemed necessary to maintain a relatively constant bit-line sensing voltage ($V_S$) across advancing processes.

The bit lines associated with DRAM cell 100 (i.e., bit line 104 and a reference bit line that is not shown) are typically pre-charged to voltage equal to $V_{CC}/2$ prior to a sensing operation (wherein $V_{CC}$ is the supply voltage). Under these conditions, the bit line sensing voltage ($V_S$) can be approximated by the following equation, wherein $C_C$ is the storage capacitance of DRAM cell 100 and $C_P$ is the parasitic bit line capacitance.

$$V_S = V_{CC}(C_C)/[2(C_C+C_P)] \qquad (1)$$

In general, the cell capacitance $C_C$ is significantly smaller than the bit line capacitance $C_P$. For example, the cell capacitance $C_C$ is typically at least three times smaller than the bit line capacitance $C_P$. Equation (1) can therefore be approximated by the following equation.

$$V_S = V_{CC}(C_C)/2C_P \qquad (2)$$

The bit line capacitance $C_P$ has two components, including a metal capacitance $C_M$ and a junction capacitance $C_J$.

The metal capacitance $C_M$, in turn, has two components, including an area capacitance $C_A$ and a side-wall capacitance $C_{SW}$. The area capacitance $C_A$ represents the capacitances that exist between the bit line and the underlying and overlying layers. The side-wall capacitance $C_{SW}$ represents the capacitance that exists between the bit line and the neighboring bit lines. Downward scaling from one process generation to another usually scales the linear dimensions of the feature sizes by a scale factor, for example 'S'. This downward process scaling causes the area capacitance $C_A$ to be reduced as the square of the process scaling-factor S. However, downward scaling also decreases the distance between neighboring bit lines, thereby causing the side-wall capacitance $C_{SW}$ to increase by the same scale factor S. The combined scaling effects of the area capacitance $C_A$ and the side-wall capacitance $C_{SW}$ results in the metal capacitance $C_M$ being reduced by approximately the scale factor S.

The junction capacitance $C_J$ is dependent on the drain junction area of the select transistor 101 (which is coupled to bit line 104), and the dopant concentration of this drain junction. Downward scaling causes the drain junction area to be reduced by a the square of the scale factor S. However, the drain junction dopant concentration increases in successive generations of process technology. These combined scaling effects result in the junction capacitance $C_J$ being reduced by approximately the scale factor S.

Because the metal capacitance $C_M$ and the junction capacitance $C_J$ both scale downward by a constant scale factor, the bit line capacitance $C_P$ also scales downward by the same scale factor. As transistors scale down from one process generation to another, the $V_{CC}$ supply voltage from which the transistors can reliably operate decreases. For example, the nominal $V_{CC}$ supply voltages for typical 0.25 um, 0.18 um, and 0.13 um processes are 2.5 Volts, 1.8 Volts, and 1.3 Volts, respectively. Thus, the $V_{CC}$ supply voltage scales downward by the same process scale from one process generation to another.

The downward scaling factor of the $V_{CC}$ supply voltage offsets the downward scaling factor of the bit line capacitance $C_P$. Thus, equation (2) can be approximated as follows for process scaling purposes (wherein 'k' is a constant).

$$V_S = k(C_C) \quad (3)$$

Thus, the sensing voltage $V_S$ can be maintained at a relatively constant level with process advancement, as long as the storage capacitance $C_C$ remains constant with process advancement. However, it is difficult to maintain a constant storage capacitance $C_C$ across advancing processes.

FIG. 2 is a cross sectional view of simple planar DRAM cell 200, which includes PMOS pass-gate select transistor 201 and storage capacitor 202. DRAM cell 200 is considered a planar cell because both select transistor 201 and storage capacitor 202 are located substantially at the surface of silicon substrate 220 (i.e., the surface of n-well region 221). Select transistor 201 includes drain 211, source 212, gate oxide 213 and gate electrode 214. Storage capacitor 202 is formed by a planar PMOS structure that includes source 212, capacitor dielectric layer 215 and counter-electrode 216. The charge stored by the planar storage capacitor 202 determines the logic state of the bit stored by DRAM cell 200. Field oxide 230 isolates DRAM cell 200 from other DRAM cells fabricated in N-well 221. DRAM cell 200 is described in more detail in U.S. Pat. No. 6,075,720 by Wingyu Leung and Fu-Chieh Hsu, entitled "Memory Cell For DRAM Embedded In Logic".

The downward scaling of planar storage capacitor 202 causes the cell capacitance $C_C$ to be reduced by a factor equal to the square of the process scaling factor S. This is because both the length and width of the planar storage capacitor 202 are reduced by the scale factor S. For this reason, it has been difficult to maintain a constant cell capacitance $C_C$ across advancing processes using planar storage capacitors.

Thus, maintaining a constant cell capacitance $C_C$ while scaling down the lateral or planar dimensions of a DRAM cell has been achieved with the introduction of complex capacitor structures and non-standard dielectric materials. For example, the cell capacitance of DRAM cells has been improved using stacked capacitor structures and trench capacitor structures.

FIG. 3 is a cross sectional view of a stacked DRAM cell 300, which includes select transistor 301 and stacked cell capacitor 302. Stacked cell capacitor 302 includes conductive elements 321-323. Conductive elements 321 and 322 form the electrode and counter-electrode, respectively, of cell capacitor 302, while conductive element 323 connects capacitor electrode 321 to the source of select transistor 301. Stacked cell capacitor 302 has a metal-insulator-metal (MIM) structure, wherein a dielectric material is located between electrode 321 and counter-electrode 322. Stacked cell capacitor 302 is formed at least partially over select transistor 301 to minimize layout area of DRAM cell 300. The capacitance of stacked capacitor 302 largely depends on the vertical height of electrode 321 and counter-electrode 322. Thus, the capacitance of stacked capacitor 302 can be increased by increasing the vertical dimensions of electrode 321 and counter-electrode 322. However, increasing these vertical dimensions such that a constant capacitance is maintained across advancing processes further complicates the process required to fabricate DRAM cell 300. DRAM cell 300 is described in more detail in U.S. Patent Application Publication No. US2005/0082586 A1 by Kuo-Chi Tu et al, entitled "MIM Capacitor Structure and Method of Manufacture".

FIG. 4 is a cross sectional view of a folded (trench) capacitor DRAM cell 400, which includes PMOS select transistor 401 and folded capacitor structure 402. Note that folded capacitor structure includes a portion that is 'folded' along the side-wall of a trench formed in field oxide region (FOX). The capacitance of trench capacitor 402 largely depends on the depth of this trench. Thus, the capacitance of trench capacitor 402 can be increased by increasing the depth of the trench. However, increasing this depth such that a constant capacitance is maintained across advancing processes further complicates the process required to fabricate DRAM cell 400. DRAM cell 400 is described in more detail in U.S. Pat. No. 6,642,098 B2 by Wingyu Leung and Fu-Chieh Hsu, entitled "DRAM Cell Having A Capacitor Structure Fabricated Partially In A Cavity And Method For Operating The Same".

Stack capacitor 302 and trench capacitor 402 each has two main capacitive components: a vertical or side-wall component and a horizontal or lateral component. In deep submicron processes such as processes with 0.13 um or smaller features, the vertical component is substantially larger than the horizontal component. The vertical component of the cell capacitance is determined by the side-wall area, which includes both a vertical dimension and a planar dimension. Process scaling tends to decrease the planar feature sizes so as to decrease the overall size of the semiconductor device. (Note that it not generally necessary to reduce the vertical feature size to reduce the overall size of the semiconductor device.) As a result, the side-wall area (and therefore the vertical component of the cell capacitance) is scaled down directly with process scale factor. Because the vertical component of the cell capacitance dominates the cell capacitance, the cell capacitance is also scaled approximately by the process scale factor.

Process scaling therefore causes both the cell capacitance and the bit line capacitance to scale down with the process scale factor for DRAM cells using stack capacitor 302 or trench capacitor 402. Consequently, it is easier to scale stack capacitor 302 and trench capacitor 402 than planar capacitor 202. However, stacked capacitor structure 302 and folded capacitor structure 402 will still exhibit a relatively low capacitance of about 1.5 to 10 femto-Farads (fF) if fabricated in accordance with a conventional CMOS process. Thus, scaling stacked capacitor structure 302 and folded capacitor structure 402 requires process modifications that provide for higher sidewalls and deeper trenches, respectively. In general, the higher the stack or the deeper the trench, the more complicated the processing steps required to form the cell capacitor.

Non-standard dielectric materials (i.e., dielectric materials other than silicon oxide) used in DRAM capacitors include silicon oxy-nitride, tantalum pentoxide and zirconium oxide. An example of a tantalum pentoxide cell is described in "A 2.5V 333 Mb/s/pin 1 Gb Double Data Rate SDRAM", by H. Yoon et al, Digest of ISSCC, 1999, pp. 412-412. The non-standard dielectric materials exhibit higher dielectric constants, which tend to increase the capacitance of the DRAM cell capacitor, thereby compensating for the reduction in capacitance due to lateral down scaling. However, the use of non-standard dielectric materials adds cost and complexity to the associated process. Note that planar capacitor 202, stacked capacitor 302 and trench capacitor 402 each includes only one dielectric layer located between the electrode and counter-electrode.

It would therefore be desirable to have a DRAM cell that is readily scalable, and can be fabricated using a CMOS process, without exhibiting the shortcomings described above.

SUMMARY

The present invention provides an improved method for scaling an embedded DRAM array from a first process to a second (advanced) process. The layout area of the DRAM cell capacitors is reduced from the first process to the second process. In a particular embodiment, the DRAM cell capacitance is scaled down directly with the process scale factor. Such DRAM cell capacitance scaling can be achieved by using a folded capacitor structure, a stacked (MIM) capacitor structure, or a trench capacitor structure.

A first $V_{CC}$ supply voltage is used to operate the embedded circuits fabricated in accordance with the first process, and a second (reduced) $V_{CC}$ supply voltage is used to operate the embedded circuits fabricated in accordance with the second process. The first $V_{CC}$ supply voltage is used to operate both logic transistors and sense amplifier transistors fabricated using the first process. However, the second $V_{CC}$ supply voltage is only used to operate the logic transistors fabricated using the second process. A voltage greater than the second $V_{CC}$ supply voltage is used to operate the sense amplifier transistors fabricated using the second process. In a particular embodiment, a voltage corresponding with the first $V_{CC}$ supply voltage is used to operate the sense amplifier transistors fabricated using the second process. Stated another way, the voltage used to operate the sense amplifier transistors remains constant from the first process to the second process. As a result, a constant sensing voltage $V_S$ is maintained from the first process to the second process.

The present invention will be more fully understood in view of the following description and drawings.

DETAILED DESCRIPTION

In accordance with the present invention, the sensing voltage $V_S$ of embedded DRAM arrays in advancing processes is maintained at a constant level by applying the same supply voltage to the DRAM sense amplifiers across these advancing processes. This is in contrast with the above-described prior art, in which the sensing voltage $V_S$ of embedded DRAM arrays in advancing processes is maintained at a constant level by maintaining a constant cell capacitance $C_C$ across these advancing processes.

In the present specification, the constant supply voltage applied to the sense amplifiers across advancing processes is designated $V_{CCS}$. Although the sense amplifier supply voltage $V_{CCS}$ remains constant, the $V_{CC}$ supply voltage continues to be reduced across advancing processes. The $V_{CC}$ supply voltage is still used to supply the rest of the on-chip circuitry (e.g., embedded logic circuits).

Substituting the constant sense amplifier supply voltage $V_{CCS}$ into equation (2) provides the following equation for the sensing voltage $V_S$.

$$V_S = V_{CCS}(C_C)/2C_P \tag{4}$$

Because $V_{CCS}$ is constant, equation (4) can be simplified as follows (where K is a constant).

$$V_S = K(C_C)/C_P \tag{5}$$

As described above, the bit line capacitance $C_P$ decreases linearly with advancing processes. Thus, the cell capacitance $C_C$ is also allowed to decrease linearly with advancing processes without changing the sensing voltage $V_S$.

Stated another way, because the sensing voltage $V_S$ is maintained at a constant level across advancing processes by controlling the sense amplifier supply voltage $V_{CCS}$, the cell capacitance $C_C$ does not need to be maintained at a constant value (e.g., 30 fF) across advancing processes. That is, the cell capacitance $C_C$ may decrease across advancing processes, thereby allowing the memory cell size to be scaled. More specifically, the memory cell size may be scaled down without incurring the higher processing cost of increasing substantially the trench depth or stack height of the cell capacitor.

Figure 4:
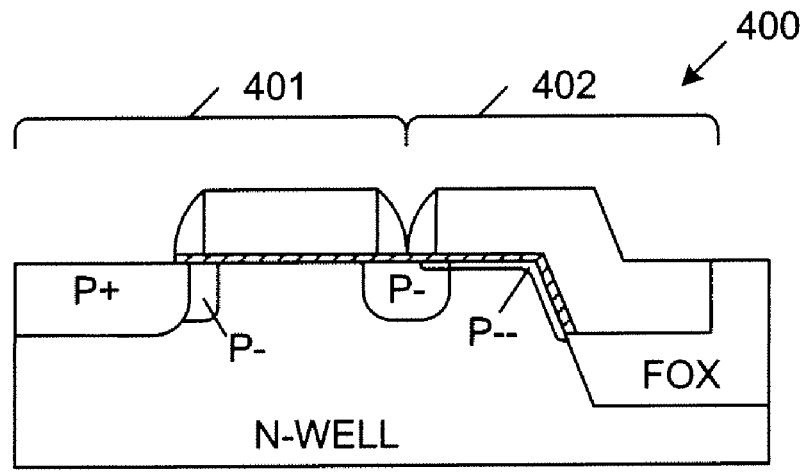
FIG. 4 is a cross sectional view of a conventional DRAM cell, which includes a PMOS select transistor coupled to a folded (trench) capacitor structure.

In accordance with one embodiment of the present invention, a DRAM array is embedded in a logic process such that the additional process steps required to construct the DRAM cells has no significant effect on the performance of the logic transistors. In one embodiment, the embedded DRAM array is fabricated in an ASIC or logic process that has critical dimensions of 0.13 microns or less. The logic transistors in this process therefore have a gate oxide thickness of approximately 20 Angstroms or less. If these logic transistors were used to construct DRAM cells as shown in FIG. 4, the gate oxide leakage would be undesirably high, thereby causing the DRAM cells to have a very short data retention time. Thus, in accordance with the described embodiments of the present invention, the gate oxide thickness of MOS devices used to form the embedded DRAM cells is modified to be approximately 26 Angstroms. A gate oxide thickness of 26 Angstroms advantageously minimizes the gate leakage of the DRAM cells, without unduly complicating the associated process. As described in more detail below, the gate oxide thickness of the DRAM cells is kept constant, and is not scaled with the process. As a result, the voltage stored in the capacitor of the DRAM cell (i.e., the sensing voltage $V_S$) can be kept substantially constant across advancing processes, without affecting the reliability of the DRAM cells.

In accordance with one embodiment of the present invention, the cell capacitor structure is selected such that the capacitance of this structure decreases linearly with advancing processes. Examples of such cell capacitor structures include folded (trench) capacitors, stacked capacitors, and normal trench capacitors such as those described in "Cosmic Ray Soft Error Rates of 16-Mb DRAM Memory Chips", by J. F. Ziegler et al, IEEE JSSC vol. 33, No. 2, February 1998, pp. 246-251.

An embedded DRAM cell structure that may be used in accordance with one embodiment of the present invention is described in more detail in commonly owned U.S. Pat. No. 6,573,548 B2 by Wingyu Leung and Fu-Chieh Hsu, entitled "DRAM cell having a capacitor structure fabricated partially in a cavity and method for operating the same", which is hereby incorporated by reference in its entirety. This DRAM cell implements a folded (trench) capacitor cell structure as illustrated in FIG. 4.

Figure 3:
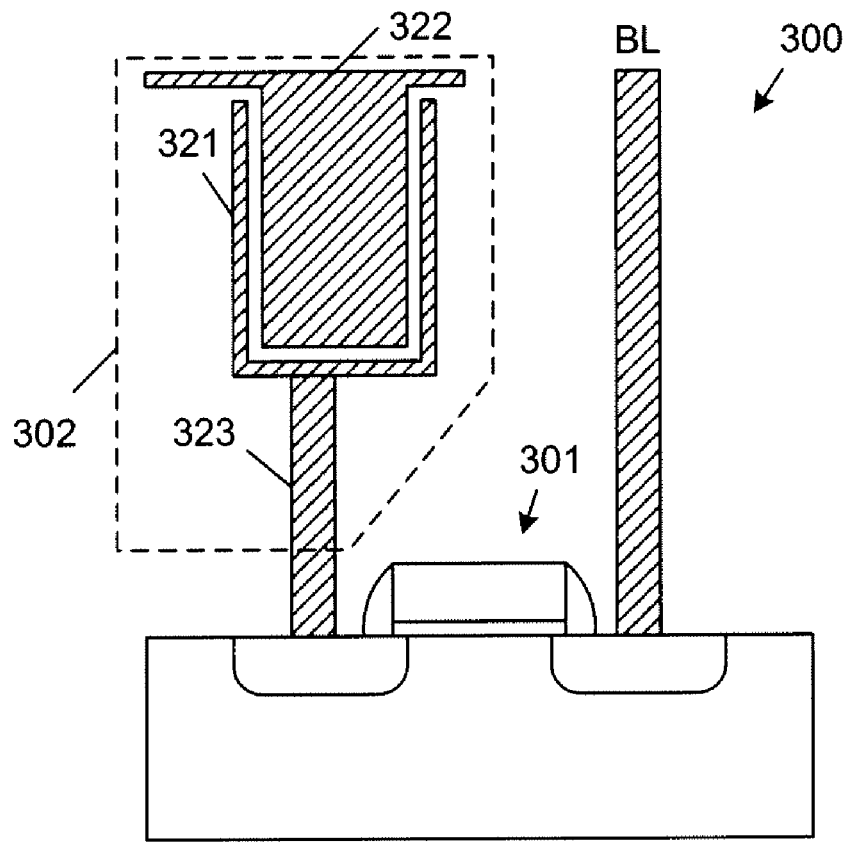
FIG. 3 is a cross sectional view of a conventional DRAM cell, which includes a select transistor coupled to a stacked cell capacitor.

Another embedded DRAM cell that may be used in accordance with the present invention is described in more detail in U.S. Patent Application Publication No. US2005/0082586 A1 by Kuo-Chi Tu et al., entitled "MIM Capacitor Structure and Method of Manufacture". This DRAM cell implements a stacked metal-insulator-metal (MIM) capacitor cell structure as illustrated in FIG. 3.

These embedded DRAM cells will have a relatively small cell capacitance of about 1.0 to 5.0 fF (even when using an oxide thickness of 26 Angstroms). To compensate for this small cell capacitance, relatively short bit lines, having a relatively small bit line capacitance $C_P$, are used in the DRAM array. In one embodiment, the bit lines are kept short by limiting the number of word lines (i.e., the number of DRAM cells per column) in the DRAM array to 64 or less. To limit the amount of loading on the circuitry generating the sense amplifier supply voltage $V_{CCS}$, the DRAM array may also use relatively short word lines, wherein the DRAM array has less than 700 columns. Within the DRAM array, a sense amplifier is required for every column. By limiting the number of columns in an array to a relatively small number, the number of sense amplifiers that are turned on during each access is limited, and therefore the power requirements of the sense amplifier voltage supply is limited for a memory operation. The short bit line and word line array organization also provides the benefits of fast memory cycle time and low operating power.

Figure 5:
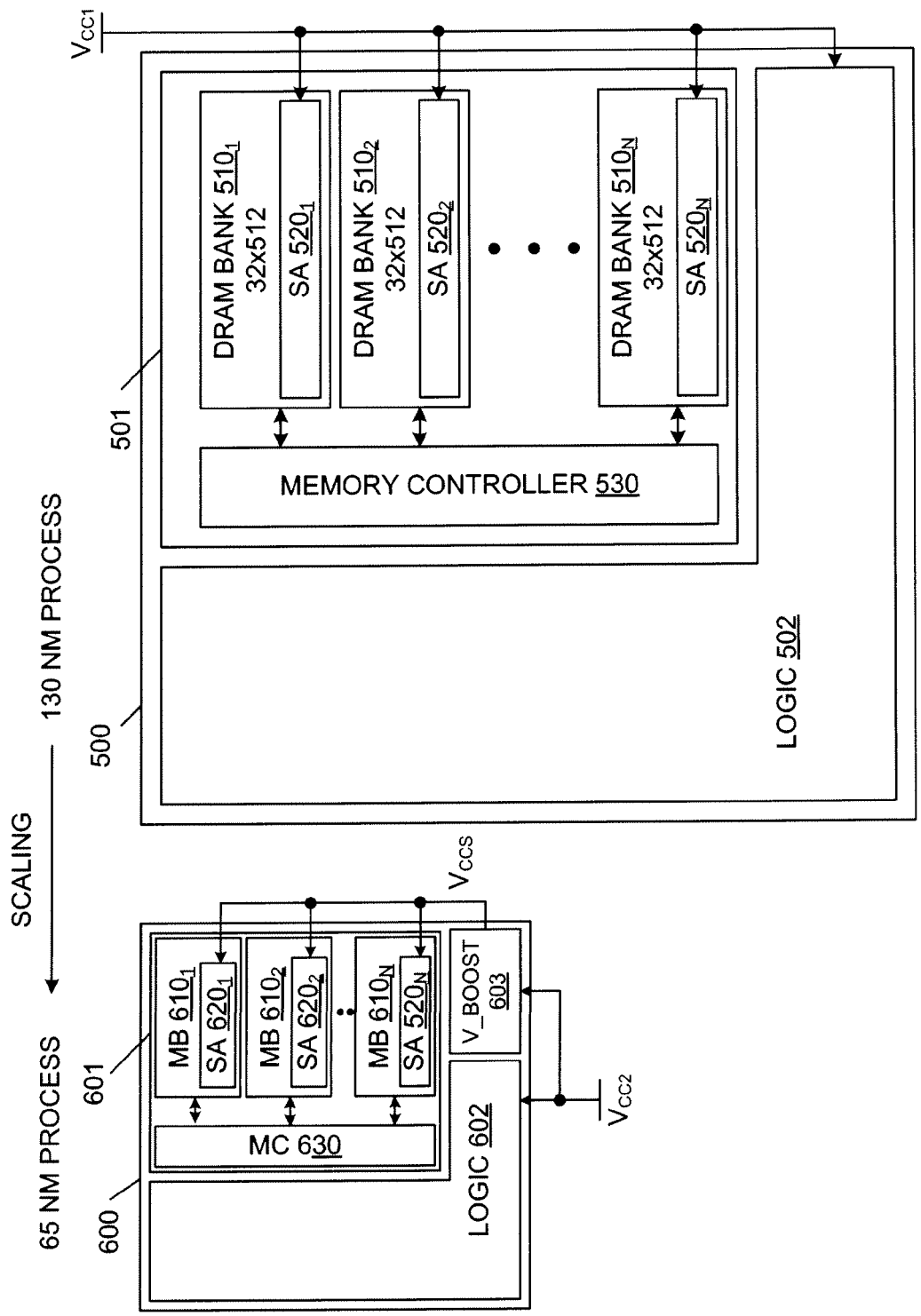
FIG. 5 is a block diagram of an integrated circuit chip fabricated using a 0.13 micron (130 nanometer) process, and a corresponding integrated circuit chip fabricated using a 65 nanometer (nm) process, in accordance with one embodiment of the present invention.

FIG. 5 is a block diagram of an integrated circuit chip 500 fabricated using a 0.13 micron (130 nanometer) process, and a corresponding integrated circuit chip 600 fabricated using a 65 nanometer (nm) process, in accordance with one embodiment of the present invention. Integrated circuit chip 500 includes embedded DRAM array 501 and logic 502, while integrated circuit chip 600 includes embedded DRAM array 601, logic circuit 602 and voltage boosting circuit 603. Embedded DRAM array 501 includes N DRAM banks $510_1$-$510_N$, each having a corresponding sense amplifier circuit $520_1$-$520_N$, and a memory controller 530. Similarly, embedded DRAM array 601 includes N DRAM banks $610_1$-$610_N$, each having a corresponding sense amplifier circuit $620_1$-$620_N$, and a memory controller 630. In the described embodiments, each of DRAM banks $510_1$-$510_N$ and $610_1$-$610_N$ includes a 32 row by 512 column array of DRAM memory cells.

In one embodiment, DRAM arrays 501 and 601 can be implemented using a 32 k×32 memory macro similar to the one described in commonly owned U.S. Pat. No. 6,504,780B2, "Method and Apparatus For Completely Hiding Refresh Operations In a DRAM Device Using Clock Division", by Wingyu Leung. This memory macro consists of 64 DRAM banks (i.e., N=64), wherein each of these DRAM banks is organized into 32 rows and 512 columns. Two separate versions of the memory macro using the same memory architecture and memory cell structure are used to design DRAM array 501 and DRAM array 601.

Within the 130 nm integrated circuit chip 500, an external $V_{CC}$ power supply, which provides a nominal $V_{CC1}$ supply voltage of 1.2 Volts, is used to operate sense amplifier circuits $520_1$-$520_N$ and logic circuit 502. However, in the 65 nm integrated circuit chip 600, an external $V_{CC}$ power supply, which provides a reduced nominal $V_{CC2}$ supply voltage of 1.0 Volts, is used to operate logic circuit 602. Voltage boosting circuit 603 generates a boosted voltage $V_{CCS}$, which is used to operate sense amplifier circuits $620_1$-$620_N$. In the described embodiment, the boosted voltage $V_{CCS}$ is selected to be equal to the $V_{CC1}$ supply voltage of integrated circuit chip 500 (i.e., 1.2 Volts).

Figure 6:
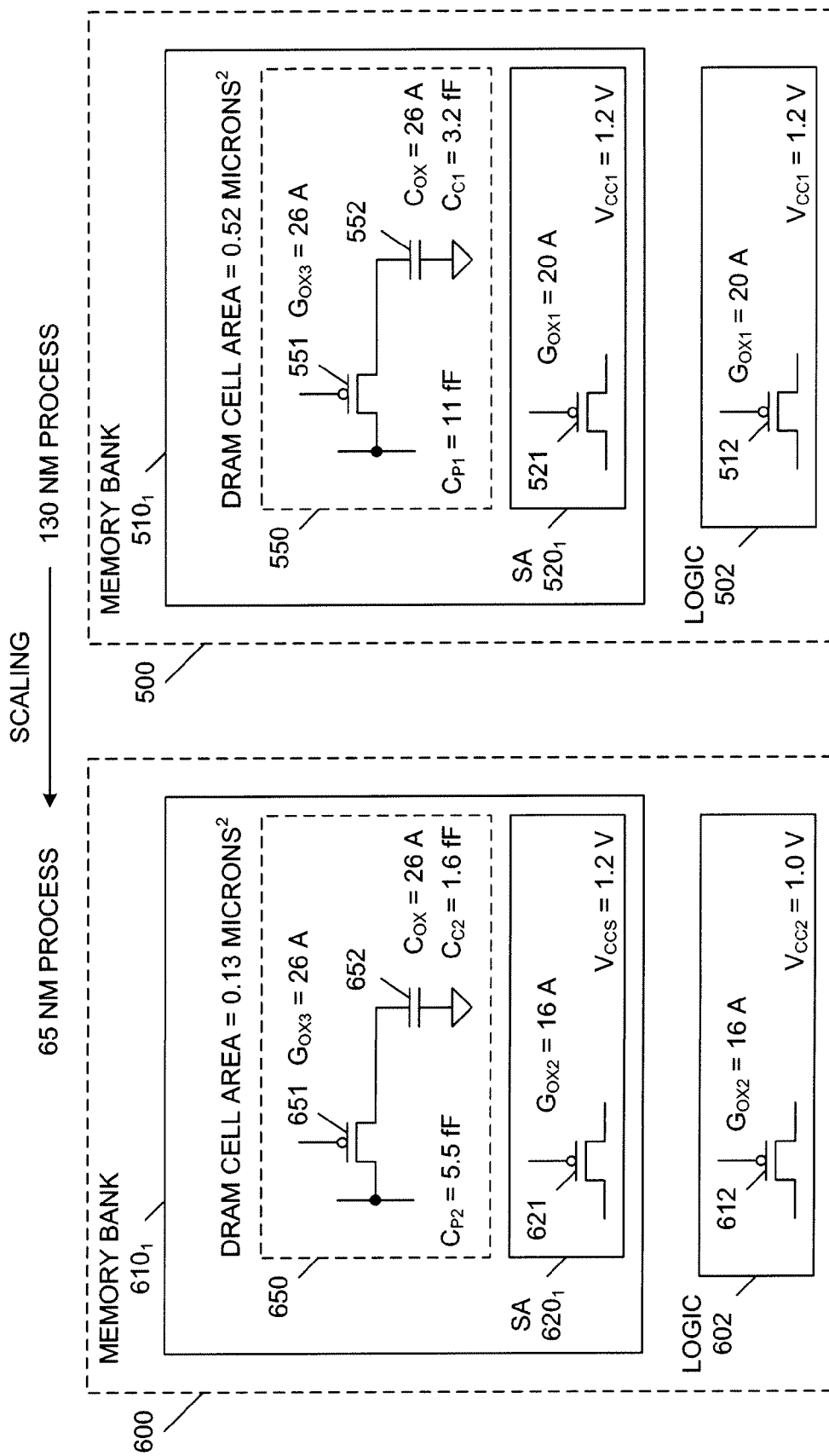
FIG. 6 is a block diagram illustrating various device parameters implemented by the integrated circuit chips of FIG. 5 in accordance with one embodiment of the present embodiment.

FIG. 6 is a block diagram illustrating various device parameters implemented by integrated circuit chips 500 and 600 in accordance with the present embodiment. More specifically, FIG. 6 illustrates: (1) DRAM cells 550 and 650, which are representative of the DRAM cells included in memory banks $510_1$ and $610_1$, respectively; (2) sense amplifier transistors 521 and 621, which are representative of the transistors implemented by sense amplifier circuits $520_1$ and $620_1$, respectively; and (3) logic transistors 512 and 612, which are representative of the transistors implemented in logic circuits 502 and 602, respectively. DRAM cell 550 includes access transistor 551 and cell capacitor 552, while DRAM cell 650 includes access transistor 651 and cell capacitor 652.

On 130 nm integrated circuit chip 500, logic transistor 512 and sense amplifier transistor 521 each has a gate oxide thickness $G_{OX1}$ of approximately 20 Angstroms. This thickness is selected to optimize the performance of logic transistor 512 and sense amplifier transistor 521 in response to the $V_{CC1}$ supply voltage of 1.2 Volts.

Within DRAM cell 550, access transistor 551 has a gate oxide thickness $G_{OX3}$ of about 26 Angstroms. Similarly, the thickness of the capacitor oxide $C_{OX}$ of cell capacitor 552 has a thickness of about 26 Angstroms. As described above, these increased oxide thicknesses advantageously increase the data retention time of DRAM cell 550. In the described example, cell capacitor 552 has a capacitance $C_{C1}$ of about 3.2 fF. DRAM cell 550 has a layout area of about 0.52 micron², and an associated bit line capacitance $C_{P1}$ of about 11 fF.

On 65 nm integrated circuit chip 600, logic transistor 612 and sense amplifier transistor 621 each has a gate oxide thickness $G_{OX2}$ of about 16 Angstroms. This thickness is selected to optimize the performance of logic transistor 612 in response to the $V_{CC2}$ supply voltage of 1.0 Volt. The channel length of logic transistor 612 corresponds with the minimum line width of the 65 nm process, thereby allowing this transistor to exhibit a fast switching time.

Sense amplifier transistor 621 operates in response to the boosted $V_{CCS}$ voltage of 1.2 Volts. To allow sense amplifier transistor 621 to operate at this higher voltage without reliability degradation, the channel length of this transistor 621 is made longer than the minimum line width of the 65 nm process. For example, sense amplifier transistor 621 may have a channel length of about 90 nm.

As mentioned above, the sense amplifier supply voltage $V_{CCS}$ of 1.2 Volts is generated by voltage boosting circuit 603 in response to the $V_{CC2}$ supply voltage of 1.0 Volt. The internally generated $V_{CCS}$ voltage has a much smaller variation (+/−50 mv) than the external $V_{CC2}$ supply voltage (+/−100 mV). This smaller variation exists because the $V_{CCS}$ voltage is used exclusively to supply the sense amplifier circuits, and because there are only 512 sense amplifier circuits in a memory block (as compared to 1024 or more in a standard DRAM array). Thus, the amount of switching current and consequently the voltage noise is minimized. The tighter voltage regulation together with the use of slightly longer channel length in the sense amplifier transistors (e.g., sense amplifier transistor 621) allows the use of a higher supply voltage in the sense-amplifier transistors without compromising the reliability of the sense-amplifier circuit.

Within DRAM cell 650, access transistor 651 has a gate oxide thickness $G_{OX3}$ of about 26 Angstroms. Similarly, the thickness of the capacitor oxide $C_{OX}$ of cell capacitor 652 has a thickness of about 26 Angstroms. In the described example, cell capacitor 652 has a capacitance $C_{C2}$ of about 1.6 fF. DRAM cell 650 has a layout area of about 0.13 micron$^2$, and an associated bit line capacitance $C_{P2}$ of about 5.5 fF.

Substituting the above-described values of $V_{CC1}$, $C_{C1}$ and $C_{P1}$ in equation (1) yields a sensing voltage $V_S$ for memory bank $510_1$ of about 0.135 Volts. Substituting the above-described values of $V_{CCS}$, $C_{C2}$ and $C_{P2}$ in equation (1) yields a sensing voltage $V_S$ for memory bank $610_1$ of about 0.135 Volts. Thus, the sensing voltage $V_S$ is not reduced when scaling from the 130 nm process to the 65 nm process. However, the bit line capacitance $C_P$ and cell capacitance $C_C$ are scaled down by half, and the DRAM cell size is scaled down in square fashion by a factor of four. This result of memory array scaling is achieved without changing the trench depth (3500 Angstroms) of the cell capacitor.

Figure 1:
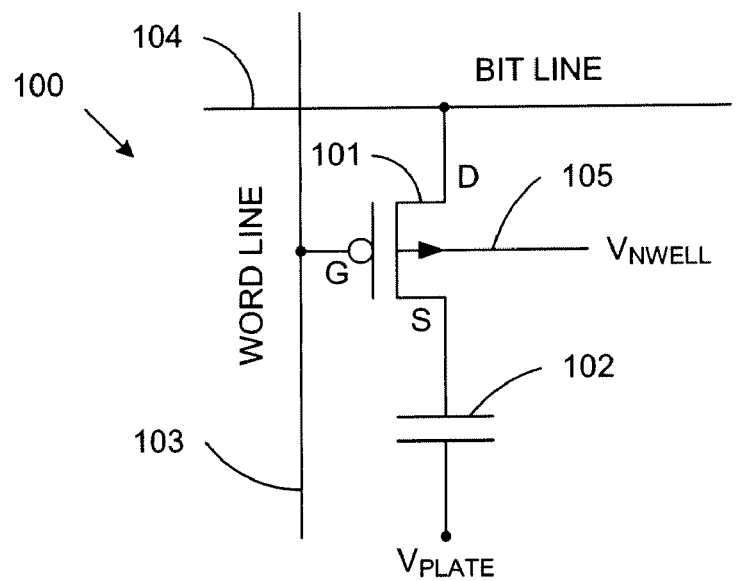
FIG. 1 is a schematic diagram of a conventional DRAM cell which includes a PMOS select transistor coupled to a storage capacitor.
Figure 7:
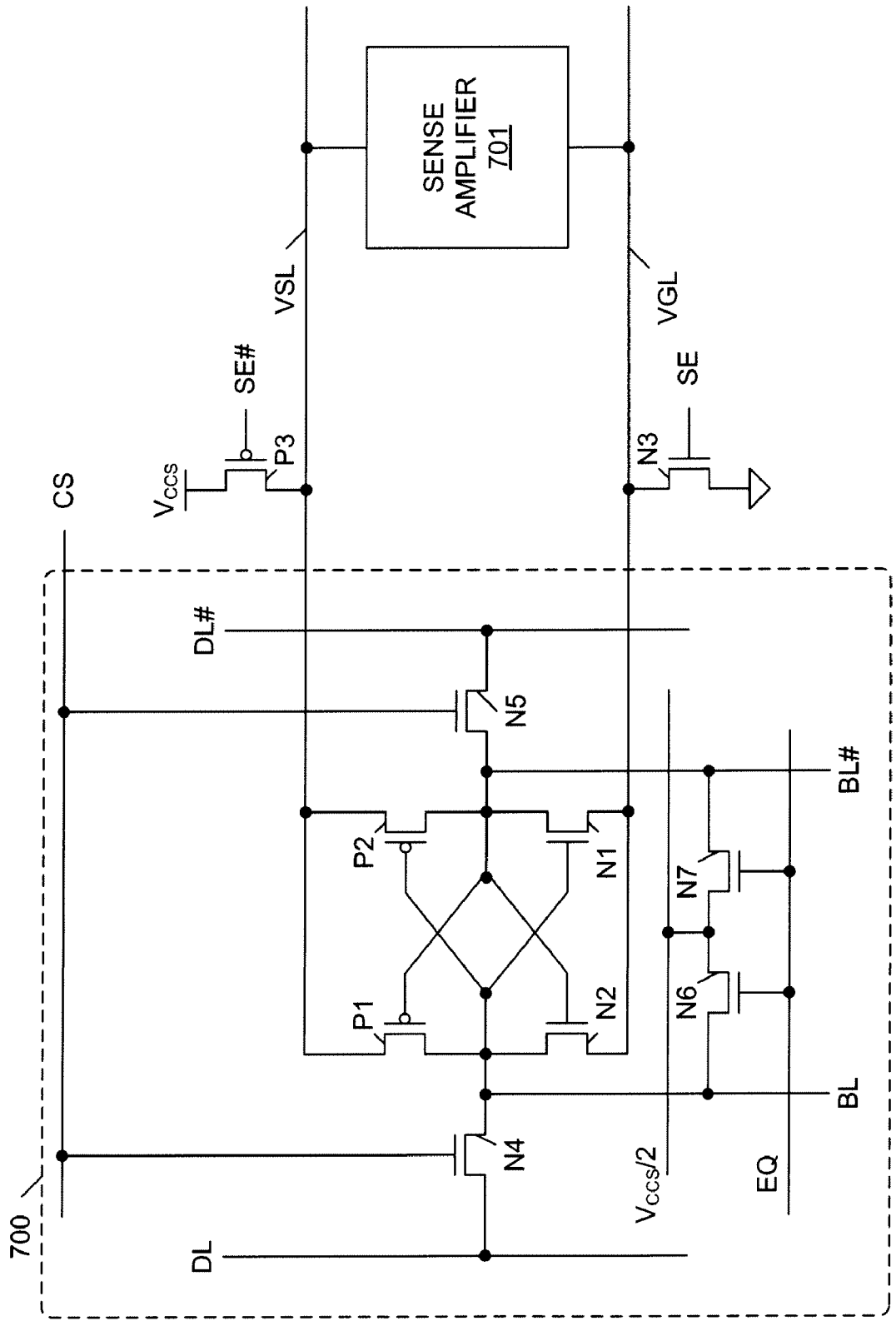
FIG. 7 is a circuit diagram of a sense amplifier for use in the integrated circuit chip of FIGS. 5 and 6 fabricated with the 65 nanometer (nm) process.

FIG. 7 is a circuit diagram of a sense amplifier 700 used in accordance with one embodiment of the present invention. For example, sense amplifier 700 may be present in sense amplifier circuit $620_1$ of FIG. 6. Sense amplifier 700 is similar to the sense amplifier shown in FIG. 1 of commonly owned U.S. Pat. No. 6,324,110 B1, "High-speed Read-write Circuitry For Semi-conductor Memory," by Wingyu Leung and Jui-Pin Tang, except that sense amplifier uses a sense amplifier power supply voltage $V_{CCS}$, which is different than the $V_{CC2}$ supply voltage used by logic circuitry within or outside the memory macro.

The bi-stable sense-amplifier 700 consists of a cross-coupled pair of PMOS transistors P1-P2 and a cross-coupled pair of NMOS transistors N1-N2. The sources of the PMOS cross-coupled pair are connected to the virtual supply line VSL. The virtual supply line VSL is common to the other sense amplifiers of the same memory block (e.g., sense amplifier 701 and the other sense amplifiers in sense amplifier circuit $620_1$). The sources of the NMOS cross-coupled pair are connected to the virtual ground line VGL. The virtual ground line VGL is common to other sense amplifiers of the same memory block. The cross-coupled transistor pairs P1-P2 and N1-N2 form a regenerative sense-amplifier, which amplifies the differential signal present on the complementary bit line pair BL and BL#. The amplified signal on the bit line pair BL and BL# is coupled to the data line pair DL and DL# through NMOS transistors N4 and N5 during a read or write access to the memory block.

NMOS transistors N6 and N7 couple bit lines BL and BL#, respectively, to a internally generated voltage which is approximately equal to half of the sense amplifier supply voltage $V_{CCS}$. The gates of transistors N6 and N7 are coupled to receive the equalization (or pre-charge) control signal EQ. When the memory block is not accessed, the equalization signal EQ is activated high, thereby pre-charging the bit lines BL and BL# to $V_{CCS}/2$. The virtual supply line VSL is coupled to the sense amplifier supply voltage $V_{CCS}$ by PMOS transistor P3. The gate of transistor P3 is coupled to receive sense amplifier enable signal SE#, which is an active low signal. Similarly, the virtual ground line VGL is coupled to the ground voltage supply by NMOS transistor N3. The gate of transistor N3 is coupled to receive sense amplifier enable signal SE, which is an active high signal (and the complement of SE#).

During a memory access, the sense amplifier enable signals SE/SE# are activated, and the regenerative latch formed by transistors P1-P2 and N1-N2 amplifies the small sense signal on bit line pair BL/BL#. The regenerative latch also performs data restoration, so that the storage capacitor of the selected DRAM cell is charged substantially close to ground or the $V_{CCS}$ supply voltage at the end of a sensing operation. The charge stored in the cell capacitor is directly proportional to the restore voltage. For a logic '1' data value the restored voltage is close to the $V_{CCS}$ sense amplifier supply voltage, and for a logic '0' data value the restored voltage is close to ground. Because the bit lines BL/BL# are pre-charged to $V_{CCS}/2$, the stored charges representing a logic '1' value and a logic '0' value are equal, but opposite in polarity. In both cases, the amount of stored charge (Q) is defined by equation (6) below.

$$Q = V_{CCS} * C_C / 2 \qquad (6)$$

By using the internally generated sense-amplifier supply voltage $V_{CCS}$, which has a higher voltage than the external power supply $V_{CC2}$, the charge stored in the DRAM cell capacitor is increased, and thus the sensing voltage ($V_S$) generated on the bit line pair BL/BL# is also increased.

The sensing time required for sense amplifier 700 to amplify the sensing voltage ($V_S$) on bit line pair BL/BL# to the full $V_{CCS}$ voltage is dominated by the initial sensing current in the regenerative latch formed by transistors P1-P2 and N1-N2 when the sense amplifier enable signals SE and SE# are activated. This initial sensing current is proportional to the square of the difference between the bit-line pre-charge voltage $V_{CCS}/2$ and the absolute threshold voltage ($V_T$) of the transistors, or $(V_{CCS}/2 - V_T)^2$.

In sense amplifier 700 (which was fabricated using the 65 nm process), the minimum value of $V_{CCS}/2$ is 0.575 Volts (i.e., (1.2 Volts−50 millivolt variation)/2). The absolute threshold voltage is about 0.4 Volts, such that the initial sensing current is equal to 0.03 k, where k is a proportional constant.

In contrast, if sense amplifier 700 were supplied by the $V_{CC2}$ supply voltage of 1.0 Volt, the minimum pre-charge voltage would be equal to 0.45 Volts (i.e., (1.0 Volt−0.1 Volt variation)/2). Again, the absolute threshold voltage is about 0.4 Volts, such that the initial sensing current would be equal to 0.0025 k. Boosting the sense amplifier supply voltage $V_{SSC}$ to 1.2 Volts in the present embodiment therefore increases the initial sensing current of sense amplifier 700 by a factor of 12, thereby increasing the sensing speed of sense amplifier 700.

In another embodiment, the transistors of sense amplifier 700 are modified to have an increased gate oxide thickness of 26 Angstroms (i.e., the same thickness as the oxide used in the DRAM cells). In this embodiment, the channel lengths of the transistor gates are all increased to 0.18 microns. The longer gate lengths and the increased gate oxide thickness allow sense amplifier supply voltage $V_{CCS}$ to be increased to 2.0 Volts, without compromising the long-term reliability of the sense amplifier 700. Increasing the channel length of the transistors to 0.18 microns increases the overall layout area of sense amplifier 700 by less than 10 percent because the layout area is dominated by interconnect structures associated with the transistors and the channel widths of these transistors, which have dimensions substantially greater than 0.18 microns. A sense amplifier supply voltage $V_{CCS}$ of 2.0 Volts allows 67 percent more charge to be stored in the DRAM cell capacitor than a sense amplifier supply voltage $V_{CCS}$ of 1.2 Volts. As a result, the cell capacitance of the memory cell can be reduced by 67 percent without affecting the sensing voltage $V_S$.

Figure 2:
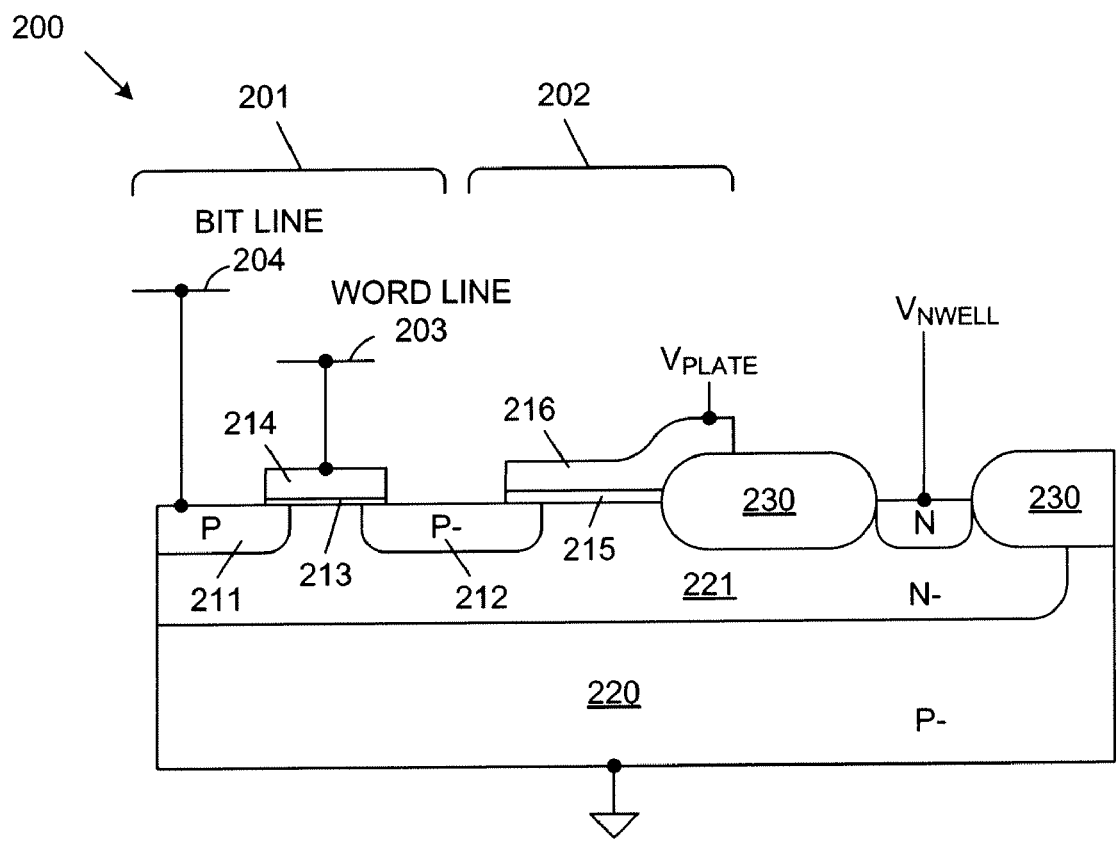
FIG. 2 is a cross sectional view of conventional planar DRAM cell, which includes a PMOS select transistor coupled to a planar storage capacitor.

The folded capacitor shown in FIG. 4 includes both a planar component and a side-wall component. The side-wall component dimension is limited by the minimum lateral design rules and the trench depth of the process. Therefore, side-wall capacitance cannot be reduced further. The planar component, however, can be reduced to design rules minimum. This results in a cell size reduction of less than 10 percent, because the lateral dimension of the original cell capacitor is already quite close the design rule limit. The benefit of this scheme is more prominent if a planar capacitor structure is used instead of trench or stack capacitor structure. This is because, as illustrated in FIG. 2, when using a planar capacitor structure, the cell size is pre-dominantly occupied by the lateral storage capacitance.

Figure 8:
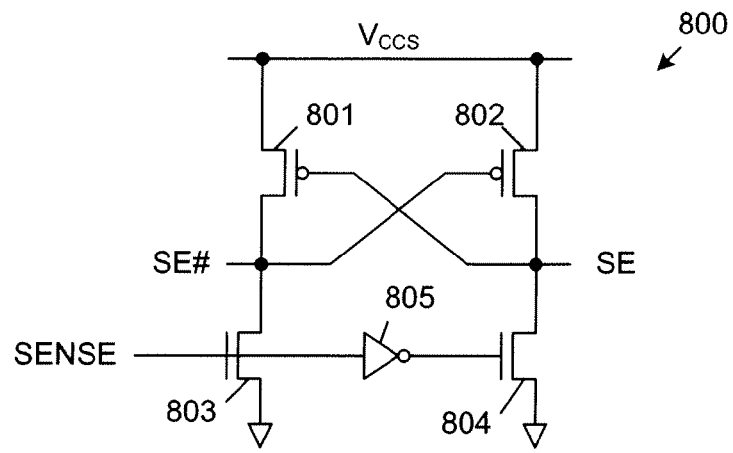
FIG. 8 is a circuit diagram of a voltage translation circuit for use in the sense amplifier circuit of FIG. 7.

Because logic circuit 602 has a voltage swing of $V_{CC2}$ to ground, the logic signals used to activate equalization circuit EQ, column select signal CS and sense amplifier enable signals SE and SE# must be translated to a voltage swing of $V_{CCS}$ to ground. FIG. 8 is a circuit diagram of a voltage translation circuit 800 that can be used for this purpose. Voltage translation circuit 800, which includes PMOS transistors 801-802, NMOS transistors 803-804 and inverter 805, generates the sense amplifier enable signals SE/SE# in response to a SENSE logic signal, which has a voltage swing of $V_{CC2}$ to 0. The equalization signal EQ and column select signal CS can be generated in a similar manner. Because voltage translation is well known in the art of memory and logic design, this circuit is not elaborated further in this disclosure.

Figure 9:
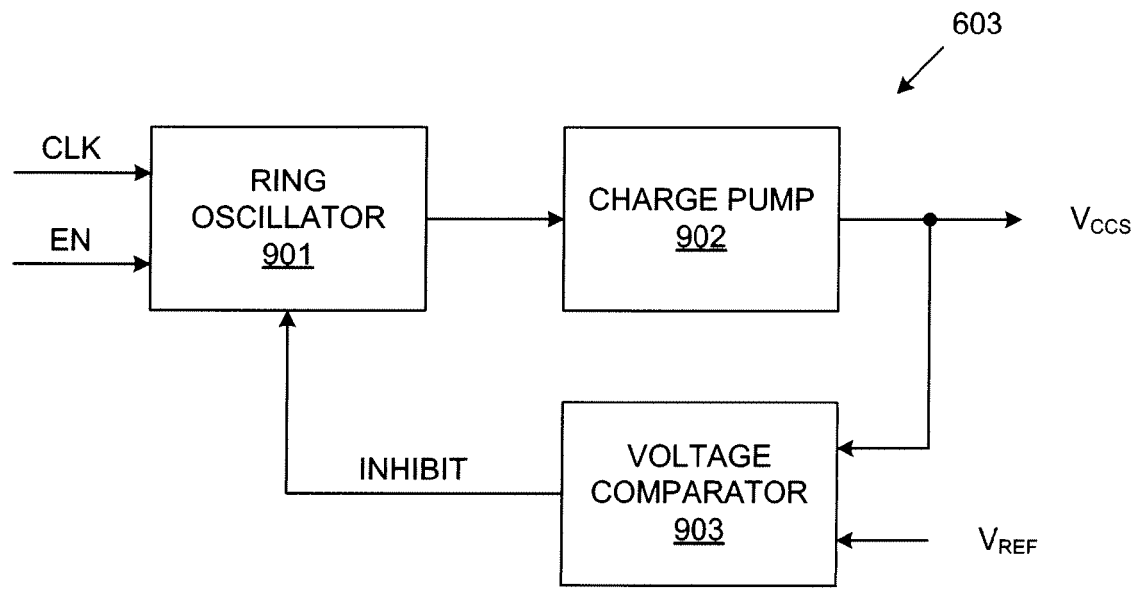
FIG. 9 is a block diagram of a boosted voltage generator used to generate a boosted sense amplifier enable signal for use in the present invention.

In accordance with one embodiment, voltage boosting circuit 603 (FIG. 6) is a charge pump regulator, which generates the sense-amplifier supply voltage $V_{CCS}$ of 1.2 Volts in response to the 1 Volt external power supply $V_{CC2}$. Charge pump regulators are well known in the art. FIG. 9 is a block diagram of a boosted voltage generator 603 used in one embodiment of the present invention. Boosted voltage generator 603 includes a ring oscillator 901, a charge pump 902 and a voltage comparator 903, which compares the output voltage $V_{CCS}$ of the generator with a reference voltage $V_{REF}$. If the reference voltage $V_{REF}$ is higher than $V_{CCS}$, then the output (INHIBIT) of voltage comparator 903 is driven low and ring oscillator 901 and charge pump 902 are enabled. When enabled, charge pump 902 causes the sense amplifier supply voltage $V_{CCS}$ to increase. When the sense amplifier supply voltage $V_{CCS}$ becomes slightly higher than the reference voltage $V_{REF}$, the INHIBIT output of voltage comparator 903 is driven high, thereby disabling ring oscillator 901 and charge pump 902. Ring oscillator 901 and charge pump 902 are conventional elements that are well documented in references such as U.S. Pat. Nos. 5,703,827 and 5,267,201. The reference voltage $V_{REF}$ can be generated external to the memory using a band-gap reference circuit such as those described in "Analysis and Design of Analog Integrated Circuits", by P. R. Gray and R. G. Meyer, John Wiley and Sons Inc. $3^{rd}$ edition, 1993, pp. 338-346.

Figure 10:
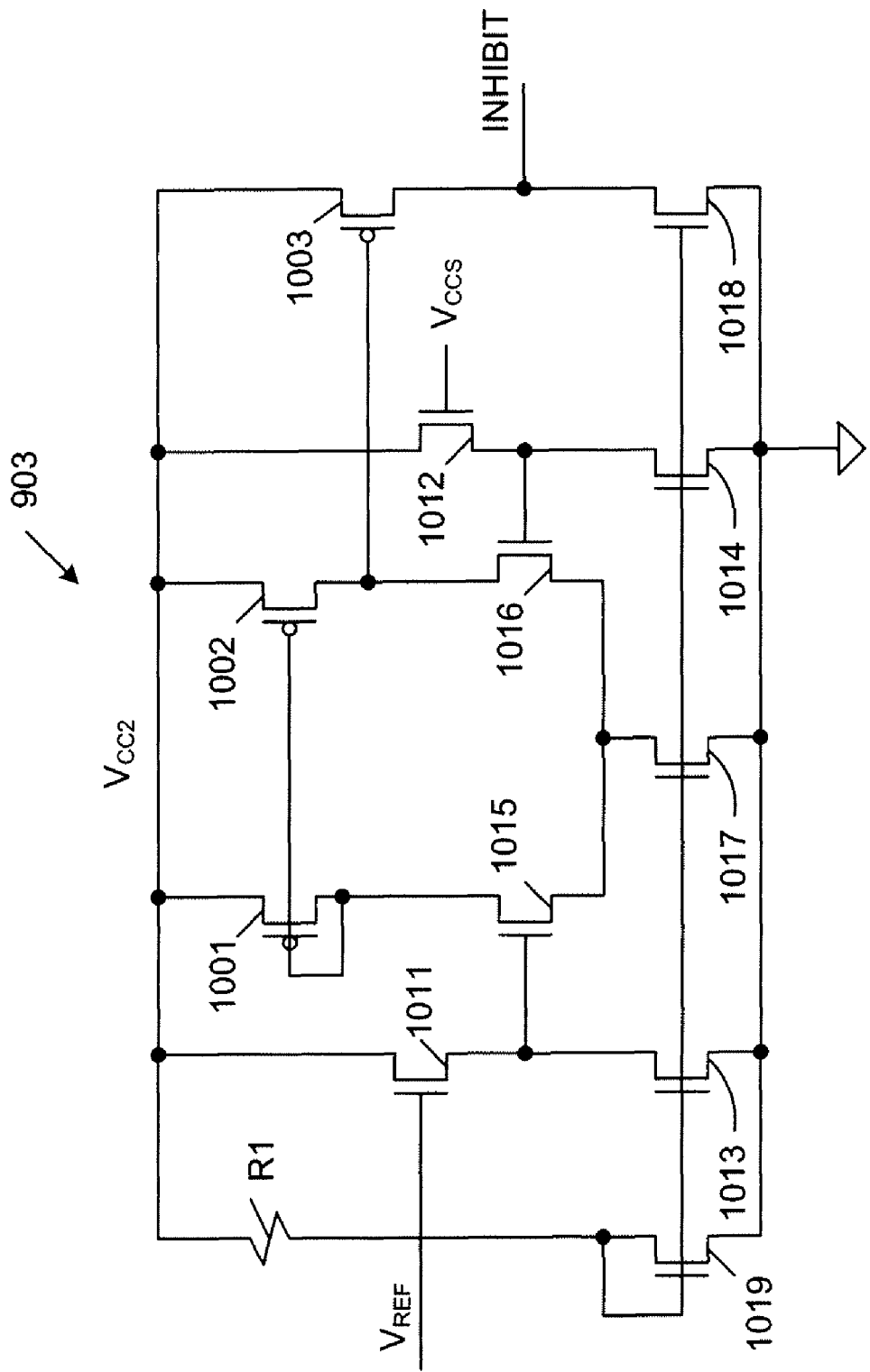
FIG. 10 is a circuit diagram of a voltage comparator including a step down circuit, which can be used in the boosted voltage generator of FIG. 9.

FIG. 10 is a circuit diagram of voltage comparator 903, as used in one embodiment of the present invention. Voltage comparator 903 includes PMOS transistors 1001-1003, NMOS transistors 1011-1019 and resistor R1. Transistors 1001-1003 and 1015-1018 form a conventional two-stage differential amplifier, which amplifies the differential signal applied to the gates of transistors 1015 and 1016. The small differential signal is amplified and converted into a full swing digital output signal, INHIBIT. Because the voltages $V_{REF}$ and $V_{CCS}$ received by comparator 903 are normally greater than $V_{CC2}$, a voltage step down circuit is used to ensure that the two stage amplifier stays in a high gain operating region. Transistors 1011-1014 form a source-follower that translates both the reference voltage $V_{REF}$ and sense amplifier supply voltage $V_{CCS}$ to values about one threshold voltage drop ($V_T$ ~0.4 Volts) lower than their respective values. Resistor R1 and transistor 1019 form a biasing circuit setting transistors 1013, 1014, 1017 and 1018 in the saturation region. By using a band-gap voltage reference with low temperature coefficient and a high gain comparator, the $V_{CCS}$ voltage can be regulated with high precision. Because the loading on the $V_{CCS}$ voltage supply is minimized by using a small bank size, with a relatively small number of sense amplifiers turning on at one time, the switching noise amplitude is minimized.

Although the present invention has been described in connection with several embodiments, it is understood that this invention is not limited to the embodiments disclosed, but is capable of various modifications, which would be apparent to one of ordinary skill in the art. Thus, the invention is limited only by the following claims.

I claim:

1. A method for scaling a first DRAM array embedded on a first chip with a first logic circuit to a second DRAM array embedded on a second chip with a second logic circuit, the method comprising:
    applying a first supply voltage to logic transistors of the first logic circuit;
    applying a second supply voltage to sense amplifier transistors of the first DRAM array, wherein the first chip is fabricated using a first generation process;
    applying a third supply voltage, less than the first supply voltage, to logic transistors of the second logic circuit; and
    applying a fourth supply voltage, greater than the third supply voltage, to sense amplifier transistors of the second DRAM array, wherein the second supply voltage and the fourth supply voltage are substantially the same, wherein the second chip is fabricated using a second generation process, different than the first generation process.

2. The method of claim 1, wherein the fourth supply voltage is equal to the first supply voltage.

3. The method of claim 1, wherein the first supply voltage is equal to the second supply voltage.

4. The method of claim 1, further comprising:
    designing the logic transistors of the first logic circuit and the sense amplifier transistors of the first DRAM array to include a first gate oxide layer having a first thickness; and
    designing the logic transistors of the second logic circuit and the sense amplifier transistors of the second DRAM array to include a second gate oxide layer having a second thickness, wherein the first thickness is greater than the second thickness.

5. The method of claim 1, further comprising:
    designing DRAM cells in the first DRAM array to include a gate oxide layer having a first thickness; and
    designing DRAM cells in the second DRAM array to include a gate oxide layer having the first thickness.

6. The method of claim 1, further comprising:
    designing DRAM cells in the first DRAM array to have a first cell capacitance; and designing DRAM cells in the second DRAM array to have a second cell capacitance, wherein the first cell capacitance is greater than the second cell capacitance.

7. The method of claim 1, further comprising:
designing DRAM cells in the first DRAM array to have a first layout area; and
designing DRAM cells in the second DRAM array to have a second layout area, wherein the first layout area is greater than the second layout area.

8. The method of claim 1, further comprising designing the sense amplifier transistors of the second DRAM array to have channel lengths greater than a minimum line width of the second generation process.

9. The method of claim 1, further comprising:
designing the logic transistors of the first logic circuit and the sense amplifier transistors of the first DRAM array to include a first gate oxide layer having a first thickness; and
designing the logic transistors of the second logic circuit to include a second gate oxide layer having a second thickness, wherein the first thickness is greater than the second thickness; and
designing the sense amplifier transistors of the second DRAM array to include a third gate oxide layer having a third thickness, wherein the third thickness is greater than the first thickness and the second thickness.

10. The method of claim 1, wherein the first generation process has a first minimum line width, and the second generation process has a second minimum line width, wherein the first minimum line width is greater than the second minimum line width.

11. A method for scaling from a first process to a second process, comprising:
fabricating a first DRAM array and a first logic circuit on a first chip in accordance with the first process, wherein the first DRAM array includes a plurality of sense amplifier transistors;
operating the first logic circuit in response to a first supply voltage;
fabricating a second DRAM array and a second logic circuit on a second chip in accordance with the second process, wherein the second DRAM array includes a plurality of sense amplifier transistors;
operating the second logic circuit in response to a second supply voltage, wherein the first supply voltage is greater than the second supply voltage; and
operating the sense amplifier transistors of the second DRAM array in response to a third supply voltage, wherein the third supply voltage is greater than the second supply voltage.

12. The method of claim 11, further comprising operating the sense amplifier transistors of the first DRAM array in response to the first supply voltage.

13. The method of claim 11, further comprising:
fabricating the first DRAM array to include a plurality of cell capacitors, each having a first capacitance; and
fabricating the second DRAM array to include a plurality of cell capacitors, each having a second capacitance, which is less than the first capacitance.

14. The method of claim 13, wherein a feature size associated with the second process is less than a feature size associated with the first process by a scale factor, and wherein the second capacitance is less than the first capacitance by the scale factor.

15. The method of claim 13, further comprising:
fabricating the cell capacitors of the first DRAM array with a first gate oxide layer having a first thickness; and
fabricating the cell capacitors of the second DRAM array with a second gate oxide layer having the first thickness.

16. The method of claim 11, further comprising:
fabricating logic transistors of the first logic circuit and the sense amplifier transistors of the first DRAM array to have a first gate oxide layer having a first thickness; and
fabricating logic transistors of the second logic circuit and the sense amplifier transistors of the second DRAM array to include a second gate oxide layer having a second thickness, wherein the first thickness is greater than the second thickness.

17. The method of claim 11, further comprising generating the third supply voltage in response to the second supply voltage on the second chip.

18. The method of claim 11, further comprising fabricating the sense amplifier transistors of the second DRAM array to have channel lengths greater than a minimum line width of the second process.

* * * * *